(12) United States Patent
Kozawa et al.

(10) Patent No.: US 8,129,092 B2
(45) Date of Patent: Mar. 6, 2012

(54) RESIST PATTERN THICKENING MATERIAL AND PROCESS FOR FORMING RESIST PATTERN, AND SEMICONDUCTOR DEVICE AND METHOD FOR MANUFACTURING THE SAME

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 786 days.

(21) Appl. No.: 11/362,211

(22) Filed: Feb. 27, 2006

(65) Prior Publication Data

US 2007/0123623 A1 May 31, 2007

(30) Foreign Application Priority Data

Nov. 30, 2005 (JP) ................................ 2005-345920

(51) Int. Cl.
*G03F 7/004* (2006.01)
*G03F 7/085* (2006.01)

(52) U.S. Cl. ...................... 430/313; 430/269; 430/270.1; 430/312; 430/330; 438/758; 438/761; 216/13; 216/16

(58) Field of Classification Search .................. 430/269, 430/270.1, 330, 312, 311, 320; 438/758, 438/761; 216/13, 16
See application file for complete search history.

(56) References Cited

U.S. PATENT DOCUMENTS

| | | | |
|---|---|---|---|
| 948,821 A | 2/1910 | McKenna | |
| 3,948,821 A | 4/1976 | deBenneville | |
| 4,298,678 A * | 11/1981 | McKeever | 430/281.1 |
| 4,820,621 A * | 4/1989 | Tanka et al. | 430/331 |
| 5,043,237 A * | 8/1991 | Blanchet-Fincher et al. | 430/56 |
| 5,106,724 A * | 4/1992 | Nogami et al. | 430/331 |
| 5,378,579 A * | 1/1995 | Arimatsu et al. | 430/281.1 |
| 5,397,675 A * | 3/1995 | Arimatsu et al. | 430/175 |
| 5,561,105 A * | 10/1996 | Honda | 510/178 |
| 5,580,695 A * | 12/1996 | Murata et al. | 430/270.1 |
| 5,886,136 A * | 3/1999 | Tanaka et al. | 528/353 |
| 5,942,367 A * | 8/1999 | Watanabe et al. | 430/170 |
| 6,432,621 B1* | 8/2002 | Nomoto et al. | 430/331 |
| 6,482,568 B1 | 11/2002 | Douki et al. | |

(Continued)

FOREIGN PATENT DOCUMENTS

CN 1421744 A 6/2003

(Continued)

OTHER PUBLICATIONS

Office Action dated Feb. 26, 2007 issued in corresponding Korean Application No. 10-2006-0019638.

(Continued)

*Primary Examiner* — Mark Eashoo
*Assistant Examiner* — Michael Salvitti
(74) *Attorney, Agent, or Firm* — Westerman, Hattori, Daniels & Adrian, LLP (57) ABSTRACT

The present invention provides a resist pattern thickening material, which can utilize ArF excimer laser light; which, when applied over a resist pattern such as an ArF resist having a line pattern or the like, can thicken the resist pattern regardless of the size of the resist pattern; which has excellent etching resistance; and which is suited for forming a fine space pattern or the like, exceeding the exposure limits. The present invention also provides a process for forming a resist pattern and a method for manufacturing a semiconductor device, wherein the resist pattern thickening material of the present invention is suitably utilized.

2 Claims, 7 Drawing Sheets

U.S. PATENT DOCUMENTS

| | | | |
|---|---|---|---|
| 6,555,607 B1 | 4/2003 | Kanda et al. | |
| 6,579,657 B1 | 6/2003 | Ishibashi et al. | |
| 6,734,248 B2 * | 5/2004 | Tanaka et al. | 524/548 |
| 2002/0037476 A1 * | 3/2002 | Kamijima | 430/311 |
| 2002/0037478 A1 * | 3/2002 | Kimura et al. | 430/321 |
| 2003/0059709 A1 * | 3/2003 | Wheeler et al. | 430/270.1 |
| 2003/0102285 A1 | 6/2003 | Nozaki et al. | |
| 2003/0113659 A1 * | 6/2003 | Hatakeyama et al. | 430/270.1 |
| 2003/0157801 A1 * | 8/2003 | Kozawa et al. | 438/689 |
| 2004/0009428 A1 * | 1/2004 | Tamura et al. | 430/280.1 |
| 2004/0029047 A1 | 2/2004 | Ishibashi et al. | |
| 2004/0072098 A1 * | 4/2004 | Kozawa et al. | 430/270.1 |
| 2004/0121260 A1 * | 6/2004 | Nakamura et al. | 430/270.1 |
| 2004/0175645 A1 * | 9/2004 | Sasaki et al. | 430/270.1 |
| 2007/0106021 A1 | 5/2007 | Kozawa et al. | |
| 2008/0073322 A1 * | 3/2008 | Nozaki et al. | 216/49 |
| 2010/0227278 A1 | 9/2010 | Kozawa et al. | |

FOREIGN PATENT DOCUMENTS

| | | |
|---|---|---|
| EP | 1 282 010 A1 | 2/2003 |
| EP | 1 429 185 A1 | 6/2004 |
| JP | 5-197151 | 8/1993 |
| JP | 10-73927 | 3/1998 |
| JP | 11-204399 | 7/1999 |
| JP | 2000-267268 | 9/2000 |
| JP | 2000-347414 | 12/2000 |
| JP | 2001-19860 | 1/2001 |
| JP | 2001-33984 | 2/2001 |
| JP | 2001-228616 | 8/2001 |
| JP | 2002-6491 | 1/2002 |
| JP | 2002-6512 | 1/2002 |
| JP | 2002-49161 | 2/2002 |
| JP | 2003-84457 | 3/2003 |
| JP | 2003-131400 | 5/2003 |
| JP | 2004-046060 A | 2/2004 |
| JP | 2004-53723 | 2/2004 |
| JP | 2004-86203 | 3/2004 |
| JP | 2004-126080 | 4/2004 |
| JP | 2004-264373 | 9/2004 |
| KR | 2001-0050495 | 6/2001 |
| WO | 2004/074941 | 9/2004 |

OTHER PUBLICATIONS

Takeo Ishibashi et al.; "Advanced Micro-Lithography Process with Chemical Shrink Technology"; The Japan Society of Applied Physics, vol. 40, Part 1, No. 1, Jan. 2001, pp. 419-425.

Mamoru Terai et al.; "Below 70-nm Contact Hole Pattern with RELACS Process on ArF Resist"; Proceedings of SPIE, vol. 5039, 2003, pp. 789-797.

Chinese Office Action dated Apr. 6, 2010, issued in corresponding Chinese Patent Application No. 200610067649.

Extended European Search Report dated Aug. 25, 2009 issued in corresponding European Patent Application No. 06003781.9-1226 / 1793274.

Japanese Office Action dated Aug. 17, 2010, issued in corresponding Japanese Patent Application No. 2005-345920 (with Partial Translation).

Decision of the Technical Board of Appeal 3.3.03. dated Jun. 24, 2008, issued in Application No. 00901499.4, cited in European Office Action dated Nov. 26, 2010 issued in corresponding European Patent Application No. 06003781.9.

European Office Action dated Nov. 26, 2010 issued in corresponding European Patent Application No. 06003781.9.

* cited by examiner

RESIST PATTERN THICKENING MATERIAL AND PROCESS FOR FORMING RESIST PATTERN, AND SEMICONDUCTOR DEVICE AND METHOD FOR MANUFACTURING THE SAME

CROSS-REFERENCE TO RELATED APPLICATIONS

This application is based upon and claims the benefits of the priority from the prior Japanese Patent Application No. 2005-345920, filed on Nov. 30, 2005, the entire contents of which are incorporated herein by reference.

BACKGROUND OF THE INVENTION

1. Field of the Invention

The present invention relates to a resist pattern thickening material that enables formation of a fine space pattern by thickening a resist pattern formed upon manufacturing of a semiconductor device, while exceeding the exposure (resolution) limits of the light sources of available exposure devices, to a process for forming a resist pattern, to a semiconductor device, and to a method for manufacturing the semiconductor device, by utilizing the resist pattern thickening material.

2. Description of the Related Art

In recent years the increase in the packing density of semiconductor integrated circuits has put LSIs and VLSIs to practical use. In keeping with this trend, interconnection patterns are downsized to as small as 200 nm or less, with the smallest ones reaching even as small as 100 nm or less. A lithographic technique is extremely important to achieve formation of fine interconnection patterns; with this lithographic technique a substrate is coated with a resist film, selectively exposed to light, and developed to form a resist pattern. Dry etching is then performed for the substrate using the resist pattern as a mask, and the resist pattern is removed to provide a desired pattern (e.g., an interconnection pattern). The lithographic technique, however, requires that exposure light (light used for exposure) have a short wavelength and that high-resolution resist materials tailored to the characteristics of the exposure light be developed.

However, reducing the wavelength of exposure light requires improvement of exposure devices, which requires a great deal of cost. Further, the development of new resist materials suitable for exposure light of shorter wavelength is not easy.

To overcome these problems, a technique has been proposed in which a fine pattern is formed by using a resist pattern thickening material (hereinafter referred to as "resist swelling agent" in some cases) by which a resist pattern made of conventional resist material is thickened and thus a fine space pattern can be obtained. For instance, Japanese Patent Application Laid-Open (JP-A) No. 10-73927 discloses a technique called RELACS. According to the disclosure, a KrF resist pattern is formed by exposing a KrF (krypton fluoride) resist film to KrF (krypton fluoride) excimer laser light of 248 nm wavelength which is deep ultraviolet light. Thereafter, the KrF resist pattern is covered with a water-soluble resin composition to form a coated film. The coated film and KrF resist pattern are then made to interact with each other at their interface with help of acid remaining in the KrF resist pattern material, so that the KrF resist pattern is thickened (hereinafter this process is referred to as "swelling" in some cases). In this way the distance between adjacent lines of the KrF resist pattern is shortened, enabling the formation of a fine space pattern. Subsequently, a desired pattern (e.g. an interconnection pattern) with the same shape as the space pattern is formed.

The RELACS technique, however, has the following problems: The KrF resist to be used is formed of an aromatic resin composition such as novolac resin and naphthoquinonediazide resin, and therefore, while aromatic rings contained in the aromatic resin composition allows KrF excimer laser light (wavelength: 248 nm) to pass through it, they absorb ArF (argon fluoride) excimer laser light (wavelength: 193 nm), which has a shorter wavelength than KrF excimer laser light, thereby preventing it from passing through the aromatic resin composition. For this reason, when the KrF resist is used, it is impossible to use ArF excimer laser light as exposure light and to form, for example, a fine interconnection pattern. Moreover, the RELACS technique also has a problem that although the resist swelling material is effective for thickening or swelling of the KrF resist, it is not suitable for thickening or swelling of the ArF resist. In addition, the resist swelling agent itself has poor etching resistance. Thus, if the ArF resist pattern, which has poor etching resistance, is intended to be thickened (swelled), it is impossible to form a pattern with the same shape as the swelled pattern on the substrate. Even when the KrF resist pattern, which has relatively excellent etching resistance, is intended to be thickened (swelled), it is impossible to perform precise etching in a case where, for example, the etching conditions are stringent, where the substrate is thick, where the KrF resist pattern is fine, and where a resist film is thin, leading to the problem that a pattern with the same shape as the swelled pattern cannot be obtained.

From the standpoint of forming fine interconnection patterns, it is desirable to use exposure light of wavelength shorter than the wavelength of KrF excimer laser light (wavelength of 248 nm), such as ArF excimer laser light (wavelength of 193 nm). When x-ray or electron beam having a wavelength shorter than ArF excimer laser light is used for pattern forming, however, it results in high cost and low productivity. Thus, the utilization of ArF excimer laser light is desired.

Accordingly, the present inventors have proposed a resist pattern thickening material capable of forming a finer ArF resist pattern by improving, using a surfactant, its compatibility with an ArF resist pattern on which the resist swelling agent cannot work effectively by the RELACS technique (see Japanese Patent Application Laid-Open (JP-A) No. 2004-126080). The use of this resist pattern thickening material composition, however, sometimes causes pattern size reduction to depend on the pattern size before thickened—the larger the pattern size before thickened, the more the amount the pattern size decreases by a thickening treatment.

Thus, a technology that can use ArF excimer laser light as exposure light in a patterning process, can sufficiently thicken an ArF resist pattern or the like to an extent that has never been achieved by the RELACS technique using the resist swelling agent, and can achieve easy, low cost formation of a finer space pattern or interconnection pattern, has yet to be provided.

It is an object of the present invention to solve the foregoing problems and to achieve the objects described below.

An object of the present invention is to provide a resist pattern thickening material, which can utilize ArF excimer laser light as exposure light in a patterning process; which, when applied over a resist pattern such as a line-space pattern, can uniformly and stably thicken the resist pattern regardless of the composition or size of the resist material while reducing the roughness of the surface thereof; which has excellent etching resistance; and which can achieve easy, efficient, and low cost formation of fine space patterns, exceeding the exposure (resolution) limits of the light source of an exposure device.

Another object of the present invention is to provide a process for forming a resist pattern, which can utilize ArF excimer laser light as exposure light in a patterning process; which can uniformly and stably thicken a resist pattern such as line-space pattern regardless of the composition or size of the resist material while reducing the roughness of the surface thereof; and which can achieve easy, efficient, and low cost formation of fine space patterns, exceeding the exposure (resolution) limits of the light source of an exposure device.

Still another object of the present invention is to provide a process for manufacturing a semiconductor device, which can utilize ArF excimer laser light as exposure light in a patterning process; which can form fine space patterns, exceeding the exposure (resolution) limits of the light source of an exposure device; and which can efficiently mass produce high-performance semiconductor devices having a fine interconnection pattern formed using the space pattern; and a high-performance semiconductor device having a fine interconnection, manufactured by the process for manufacturing a semiconductor device.

SUMMARY OF THE INVENTION

The means for solving aforesaid problems are described in attached claims. Specifically, the resist pattern thickening material of the present invention contains at least a compound represented by the following general formula (1):

General Formula (1)

where R represents a moiety having a structure, X represents a monovalent organic group containing a carboxylic group, Y represents at least any one of a hydroxyl group, an alkyl group, an alkoxy group, an amino group, an amino group substituted with an alkyl group, a carbonyl group and an alkoxycarbonyl group, m represents an integer of 1 or greater, and n represent an integer of 0 or greater.

When the resist pattern thickening material is applied over the resist pattern, the resist pattern thickening material infiltrates the resist pattern at their interface to interact (mix) with the resist pattern material. At this point the resist pattern thickening material has excellent compatibility with the resist pattern and thus results in efficient formation of a surface layer (mixing layer), a layer in which the resist pattern thickening material and the resist pattern are mixed, on the surface of the resist pattern which now serves as an inner layer. In this way the resist pattern is efficiently thickened by means of the resist pattern thickening material. The resist pattern thus thickened (hereinafter referred to as "swelled" in some cases) in this way has been uniformly thickened by means of the resist pattern thickening material (hereinafter such a resist pattern may be referred to as "thickened resist pattern" in some cases). Thus, a space pattern formed using the thickened resist pattern has a fine structure, exceeding the exposure (resolution) limits. It should be noted that the resist pattern thickening material of the present invention contains a compound which is represented by the general formula (1) and has a carboxyl group, and thus exhibits an excellent, uniform resist pattern-thickening effect regardless of the type of the resist pattern material, resist pattern size or the like, which means that such an effect is less dependent on the type of the resist pattern material, resist pattern size or the like. In addition, compounds represented by the general formula (1) have a moiety having a cyclic structure, thereby imparting the resist pattern thickening material of the present invention with excellent etching resistance. For these reasons, the resist pattern thickening material of the present invention can be suitably used for the formation of such resist patterns as line-patterns, which are adopted in the interconnection layers of LOGIC LSIs provided with resist patterns of various sizes.

The process of the present invention for forming a resist pattern includes: forming a resist pattern; and applying the resist pattern thickening material of the present invention on the resist pattern so as to cover the surface thereof.

In this process for forming a resist pattern a resist pattern is formed, and the resist pattern thickening material of the present invention is then applied thereon, whereby the resist pattern thickening material infiltrates the resist pattern at their interface to interact (mix) with the resist pattern material, leading to the formation of a surface layer (mixing layer), a layer in which the resist pattern thickening material and the resist pattern are mixed, on the surface of the resist pattern which in turn serves as an inner layer. In this way the resist pattern is uniformly thickened by means of the resist pattern thickening material. Thus, the space pattern formed using the thickened resist pattern has a fine structure, exceeding the exposure (resolution) limits. It should be noted that the resist pattern thickening material of the present invention contains a compound which is represented by the general formula (1) and has a carboxyl group, and thus exhibits an excellent, uniform resist pattern-thickening effect regardless of the type of the resist pattern material, resist pattern size, or the like, which means that such an effect is less dependent on the type of the resist pattern material, resist pattern size or the like. In addition, compounds represented by the general formula (1) have a moiety having a cyclic structure, thereby imparting the resist pattern thickening material of the present invention with excellent etching resistance. For these reasons, the resist pattern thickening material of the present invention can be suitably used for the formation of such resist patterns as line-patterns, which are adopted in the interconnection layers of LOGIC LSIs provided with not only contact hole patterns, but also resist patterns of various sizes.

The method of the present invention for manufacturing a semiconductor device includes: forming a resist pattern on a surface of a workpiece; applying the resist pattern thickening material according to claim 1 of the present invention over the resist pattern so as to cover a surface of the resist pattern to thereby thicken the resist pattern; and etching the surface of the workpiece using the thickened resist pattern as a mask so as to pattern the surface of the workpiece.

In this method for manufacturing a semiconductor device a resist pattern is formed on the surface of the workpiece, where a pattern such as an interconnection pattern is to be formed, and then the resist pattern thickening material of the present invention is applied over the workpiece so as to cover the surface thereof, whereby the resist pattern thickening material infiltrates the resist pattern at their interface to interact (mix) with the resist pattern material, leading to the formation of a surface layer (mixing layer), a layer in which the resist pattern thickening material and the resist pattern are mixed, on the surface of the resist pattern which in turn serves as an inner layer. In this way the resist pattern is uniformly thickened by means of the resist pattern thickening material. Thus, the space pattern formed using the thickened resist pattern has a fine structure, exceeding the exposure (resolution) limits. It should be noted that the resist pattern thickening material of the present invention contains a compound which is represented by the general formula (1) and has a carboxyl group, and thus exhibits an excellent, uniform resist pattern-thickening effect regardless of the type of the resist pattern material, resist pattern size or the like, which means that such an effect is less dependent on the type of the resist pattern material, resist pattern size, or the like. In addition, compounds represented by the general formula (1) have a moiety having a cyclic structure, thereby imparting the resist pattern thickening material of the present invention with excellent etching resistance. For these reasons, the resist pattern thickening material of the present invention can be suitably used for the formation of such resist patterns as line-patterns, which are adopted in the interconnection layers of LOGIC LSIs provided with not only contact hole patterns, but also resist patterns of various sizes.

Subsequently, by etching the surface of the workpiece using the thickened resist pattern as a mask, the surface of the workpiece is patterned finely and precisely with accurate dimension, whereby high-quality, high performance semiconductor devices having fine, precise interconnection patterns with accurate dimension can be produced efficiently.

The semiconductor device of the present invention is manufactured by the process of the present invention for manufacturing a semiconductor device. The semiconductor device has fine, precise patterns including interconnection patterns with accurate dimension, and is of high quality and performance.

DESCRIPTION OF THE PREFERRED EMBODIMENTS (Resist Pattern Thickening Material)

The resist pattern thickening material of the present invention contains at least a resin and a compound represented by the following general formula (1), and further contains a surfactant, an organic solvent and/or an additional component on an as-needed basis, which are appropriately selected.

General Formula (1)

where R represents a moiety having a cyclic structure, X represents a monovalent organic group containing a carboxylic group, Y represents at least any one of a hydroxyl group, an alkyl group, an alkoxy group, an amino group, an amino group substituted with an alkyl group, a carbonyl group and an alkoxycarbonyl group, m represents an integer of 1 or greater, and n represent an integer of 0 or greater.

The resist pattern thickening material of the present invention is water soluble or alkali soluble; its water solubility is not particularly limited and can be appropriately set depending on the intended use. For example, the resist pattern thickening material preferably has a solubility of at least 0.1 g per 100 g of 25° C. water.

Meanwhile, the alkali solubility of the resist pattern thickening material is not particularly limited and can be appropriately set depending on the intended use. For example, the resist pattern thickening material preferably has a solubility of at least 0.1 g per 100 g of 2.38% (by mass) aqueous solution of tetramethylammoniumhydroxide (TMAH) having a temperature of 25° C.

The form in which the resist pattern thickening material of the present invention is present is not particularly limited; it may be present in the form of an aqueous solution, colloidal solution or emulsion solution. Preferably, the resist pattern thickening material is present in the form of aqueous solution.

—Resin—

The resin is not particularly limited and can be appropriately selected depending on the intended use. However, water-soluble resins or alkali-soluble resins are preferably used.

For the resin, resins that contain two or more polar groups are preferable in light of their excellent water solubility or alkali solubility.

The polar group is not particularly limited and can be appropriately selected depending on the intended use; suitable examples thereof include a hydroxyl group, amino group, sulfonyl group, carbonyl group, carboxyl group and derivative groups thereof. These groups may be contained in the resin singly or in combination.

If the resin is a water-soluble resin, it preferably has a solubility of at least 0.1 g per 100 g of 25° C. water.

Examples of the water-soluble resin include polyvinyl alcohol, polyvinyl acetal, polyvinyl acetate, polyacrylic acid, polyvinylpyrrolidone, polyethyleneimine, polyethyleneoxide, a styrene-maleic acid copolymer, polyvinylamine, polyallylamine, oxazoline group-containing water-soluble resins, water-soluble melamine resins, water-soluble urea resins, alkyd resins, sulfonamide resins, cellulose and tannin.

If the resin is an alkali-soluble resin, it preferably has a solubility of at least 0.1 g per 100 g of 2.38% (by mass) aqueous solution of tetramethylammoniumhydroxide (TMAH) having a temperature of 25° C.

Examples of the alkali-soluble resins include novolac resins, vinylphenol resins, polyacrylic acid, polymethacrylic acid, poly-p-hydroxyphenylacrylate, poly-p-hydroxyphenylmethacrylate and copolymers thereof.

These resins may be used singly or in combination. Among these, polyvinyl alcohol, polyvinyl acetal, polyvinyl acetate, polyvinylpyrrolidone, cellulose and tannin are preferably used.

The content of the resin in the resist pattern thickening material can be appropriately determined depending on the type, content, etc. of the compound represented by the general formula (1), surfactant or the like to be described later.

—Compounds Represented by the General Formula (1)—

The compounds represented by the general formula (1) are not particularly limited as long as they have a moiety having a cyclic structure containing a carboxylic group and are represented by the following general formula (1); they are selected depending on the intended use. The fact that these compounds have such a moiety having a cyclic structure is also advantageous because it is possible to impart excellent etching resistance to the resist pattern thickening material.

General Formula (1)

where R represents a moiety having a cyclic structure, X represents a monovalent organic group containing a carboxylic group, Y represents at least any one of a hydroxyl group, an alkyl group, an alkoxy group, an amino group, an amino group substituted with an alkyl group, a carbonyl group and an alkoxycarbonyl group, m represents an integer of 1 or greater and preferably represents 1 because it is possible to prevent the occurrence of cross-linking reactions and for easy reaction control, and n represent an integer of 0 or greater and is preferably in a range of 0 to 2 in light of water-solubility.

The R in the general formula (1) is not particularly limited as long as it has a cyclic structure and can be appropriately selected depending on the intended use; suitable examples thereof include cyclic moieties containing at least one selected from the group consisting of aromatic hydrocarbons, heterocyclic compounds and alicyclic compounds.

The cyclic moieties containing the aromatic hydrocarbons are not particularly limited and can be appropriately selected depending on the intended use. Such cyclic moieties preferably contain, for example, an aromatic ring; specific examples of the aromatic ring include a benzene ring and a naphthalene ring.

The cyclic moieties containing the heterocyclic compounds are not particularly limited and can be appropriately selected depending on the intended use. Such cyclic moieties preferably contain, for example, pyridine and/or pyrimidine.

The cyclic moieties containing the alicyclic compounds are not particularly limited, and can be appropriately selected depending on the intended use. Such cyclic moieties preferably contain, for example, a cyclohexyl ring, norbornyl and/or adamantane.

The X in the general formula (1) is not particularly limited as long as it represents a monovalent organic group containing a carboxylic group, and can be appropriately selected depending on the intended use. In light of water-solubility, the X preferably represents an organic group containing two or more of groups selected from the group consisting of a hydroxyl group, an alkyl group, an alkoxy group, an amino group, an amino group substituted with an alkyl group, a carbonyl group and an alkoxycarbonyl group at the same time; among these, organic groups containing at least one of a hydroxyl group and an amino group at the same time are preferably used.

The Y in the general formula (1) needs to represent at least one of a hydroxyl group, an alkyl group, an alkoxy group, an amino group, an amino group substituted with an alkyl group, a carbonyl group and an alkoxycarbonyl group. Among these, the Y preferably represents a hydroxyl group or an amino group.

Specific examples of the compounds represented by the general formula (1) include mandelic acid, phenylalanine, phenylglycine, tyrosine, phenyllactic acid, hydroxyphenylpyruvic acid, hydroxydimethylphenylpropionic acid, aminotetralincarboxylic acid, aminophenylpropionic acid, phenylglutamic acid, phenylenedipropionic acid, benzylserine, naphthylalanine, methylcyclohexanecarboxylic acid, aminocyclohexanecarboxylic acid, aminobicycloheptanecarboxylic acid and hydroxyadamantanecarboxylic acid. These compounds may be used singly or in combination. Among these compounds, phenyllactic acid, phenylalanine and phenylglycine, in which in the general formula (1) the X contains a carboxylic group and a hydroxyl group or amino group at the same time, are preferable because they have high water-solubility and thus can be dissolved in water in large amounts.

The content of the compound represented by the general formula (1) in the resist pattern thickening material is not particularly limited, and can be appropriately determined depending on the intended use; the content of such a compound is preferably 0.01 part to 50 parts by mass, more preferably 0.1 part to 10 parts by mass of the total mass of the resist pattern thickening material.

If the content of the compound represented by the general formula (1) is less than 0.01 part by mass, the resist pattern thickening material may be less reactive with a resist pattern than desired. Whereas if the content is greater than 50 parts by mass, it is highly likely that the compound precipitates during a coating process, and that defects occur on the pattern formed.

—Surfactant—

When it is required, for example, to improve compatibility between a resist pattern thickening material and a resist pattern, to thicken the resist pattern to a greater extent, to improve in-plane uniformity of a thickening effect at the interface between the resist pattern thickening material and the resist pattern, and to provide anti-foaming properties, the addition of the surfactant can fulfill the requirements.

The surfactant is not particularly limited and can be selected depending on the intended use; examples thereof include nonionic surfactants, cationic surfactants, anionic surfactants and amphoteric surfactants. These may be used singly or in combination. Among these, nonionic surfactants are preferable because they contain no metallic ion, such as sodium ion and potassium ion.

Suitable examples of the nonionic surfactants include alkoxylate surfactants, fatty acid ester surfactants, amide surfactants, alcohol surfactants and ethylenediamine surfactants; specific examples thereof include polyoxyethylene-polyoxypropylene condensation products, polyoxyalkylene alkyl ethers, polyoxyethylene alkyl ethers, polyoxyethylene derivatives, sorbitan fatty acid esters, glycerine fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, natural alcohols, ethylenediamines and secondary alcohol ethoxylates.

The cationic surfactants are not particularly limited and can be selected depending on the intended use; examples thereof include alkyl cationic surfactants, amide quaternary cationic surfactants and ester quaternary cationic surfactants.

The amphoteric surfactants are not particularly limited and can be appropriately selected depending on the intended use; examples thereof include amine oxide surfactants and betaine surfactants.

The content of the surfactant in the resist pattern thickening material is not particularly limited, and can be appropriately determined depending on the type, content, etc. of the resin, the compound represented by the general formula (1) or the like; for example, the content of the surfactant is preferably 2 parts by mass or less per 100 parts by mass of the resist pattern thickening material. If the content of the surfactant exceeds 2 parts by mass, it is highly likely that the surfactant precipitates during a coating process, and that defects occur on the pattern formed.

The resist pattern thickening material of the present invention does not contain a surfactant as an essential component because it already has high compatibility with a resist pattern and can provide a thickening effect without help of such a surfactant. For this reason, the lower limit of the content of such a surfactant is not particularly specified; however, the content of such a surfactant is preferably in a range of 0.08 part to 0.5 part by mass, inside of which it is certain that the foregoing surfactant effect can be obtained.

—Organic Solvent—

The organic solvent can be added to the resist pattern thickening material of the present invention in order to increase the solubilities of the resin, the compound represented by the general formula (1) and the surfactant, which are contained in the resist pattern thickening material.

The organic solvent is not particularly limited and can be appropriately selected depending on the intended use; examples thereof include alcohol organic solvents, linear ester organic solvents, cyclic ester organic solvents, ketone organic solvents, linear ether organic solvents and cyclic ether organic solvents.

The organic solvent can be mixed with water for use. Suitable examples of water are pure water (deionized water).

Examples of the alcohol organic solvents include methanol, ethanol, propyl alcohol, isopropyl alcohol and butyl alcohol.

Examples of the linear ester organic solvents include ethyl lactate and propylene glycol methyl ether acetate (PGMEA).

Examples of the cyclic ester organic solvents include lactone organic solvents such as γ-butyrolactone.

Examples of the ketone organic solvents include acetone, cyclohexanone and heptanone.

Examples of the linear ether organic solvents include ethyleneglycol dimethylether.

Examples of the cyclic ether organic solvents include tetrahydrofuran and dioxane.

These organic solvents can be used singly or in combination. Among these organic solvents, those with boiling points from about 80° C. to 200° C. are preferable because it is possible to achieve precise resist pattern thickening. The content of the organic solvent in the resist pattern thickening material can be determined depending on the type, content, etc. of the resin, the compound represented by the general formula (1), the surfactant or the like.

—Additional Component—

The additional component is not particularly limited as long as it never adversely affects the effects of the present invention, and can be appropriately selected depending on the intended use; examples thereof include various types of known additives, including quenchers such as amines and amides.

The content of the additional component in the resist pattern thickening material can be determined depending on the type, content, etc. of the resin, the compound represented by the general formula (1), the surfactant or the like.

—Usages—

The resist pattern thickening material of the present invention can be used by applying it on a resist pattern.

Upon application of the resist pattern thickening material the surfactant may be applied on the resist pattern before coating the resist pattern with the resist pattern thickening material, rather than applying the surfactant after mixing it with the resist pattern thickening material.

When the resist pattern thickening material is applied onto the resist pattern and made to interact or mix with it, the resist pattern thickening material undergoes an interaction with the resist pattern to form a mixing layer on the surface of the resist pattern. As a result, the resist pattern is thickened by an amount corresponding to the mixing layer, and a thickened resist pattern is formed.

Since the resist pattern thickening material contains a compound represented by the general formula (1) at this point, an excellent and uniform thickening effect can be obtained regardless of the type, size, etc. of the resist pattern material, which means that the amount thickened is less dependent on the type and/or size of the resist pattern material.

The opening-diameter and/or line-width of a space pattern formed using the thickened resist pattern is smaller than the opening-diameter and/or line-width of the one formed using a resist pattern that is not thickened. In this way a fine space pattern can be provided, exceeding the exposure or resolution limits of the light source of an exposure device used for resist pattern patterning, i.e., the space pattern has an opening-diameter and/or line-width smaller than the minimum that can be achieved at the minimum possible wavelength of light applied for the light source. Thus, when the resist pattern, which has been obtained using ArF excimer laser beam, is thickened by means of the resist pattern thickening material of the present invention and the thickened resist pattern is to be used for the formation of a space pattern, the resultant space pattern has as fine precise lines and/or holes as those obtained by using, for example, an electron beam.

Note that the amount of the resist pattern thickened can be controlled to fall within a desired range by appropriately adjusting, for example, the viscosity, coat thickness, baking temperature, baking time of the resist pattern thickening material.

—Resist Pattern Material—

The material for the resist pattern material where the resist pattern thickening material of the present invention is to be applied is not particularly limited and can be appropriately selected from known resist materials depending on the intended use. In addition, the resist pattern material may be either of negative or positive type; examples thereof include g-ray resists, i-ray resists, KrF resists, ArF resists, $F_2$ resists and electron-beam resists, which can be patterned using g-ray, i-ray, KrF excimer laser, ArF excimer laser, $F_2$ excimer laser, electron beam and the like. These resists may be of either chemically amplified or non-chemically amplified type. Among them, KrF resists, ArF resists, and resists containing acrylic resins are preferable; furthermore, ArF resists and resists containing acrylic resins, where the need to improve their resolution limits is imperative, are more preferable in order to provide finer patterning and to improve throughput.

Specific examples of the resist pattern materials include novolac resists, PHS resists, acrylic resists, cycloolefin-maleic acid anhydrate (COMA) resists, cycloolefin resists, hybrid resists such as alicyclic acrylic-COMA copolymers. These resists may be modified by fluorine.

The forming process, size, thickness, etc. of the resist pattern are not particularly limited and can be appropriately set depending on the intended use. In particular, the thickness generally ranges from about 0.3 μm to 700 μm, though it can be appropriately determined depending on the type of the surface of a workpiece, etching conditions, etc.

Hereinafter, the process for thickening the resist pattern by means of the resist pattern thickening material of the present invention will be described with reference to the drawings.

Figure 1:
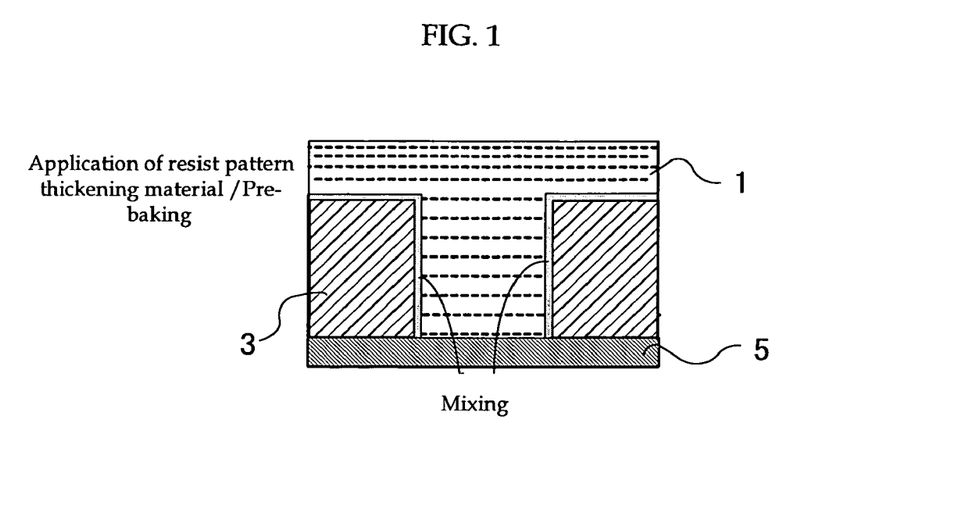
FIG. 1 is an explanatory diagram of a mechanism by which a resist pattern is thickened by means of a resist pattern thickening material of the present invention, showing a state where the resist pattern thickening material is attached to the resist pattern surface.
Figure 2:
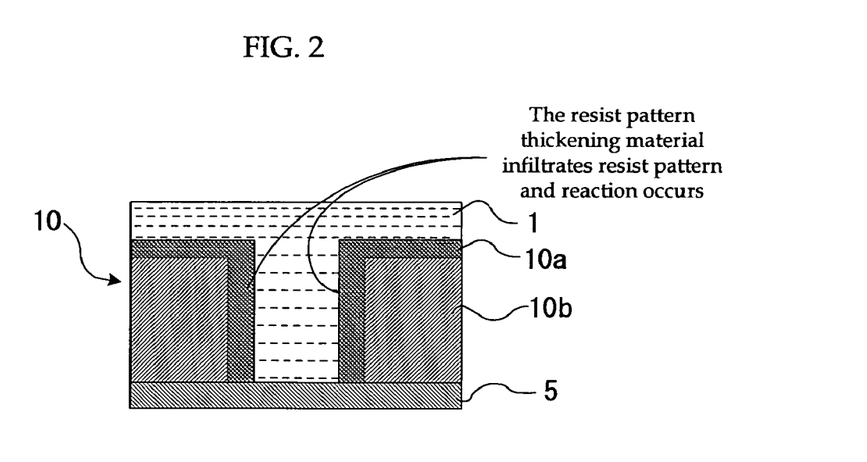
FIG. 2 is an explanatory diagram of the mechanism by which the resist pattern is thickened by means of the resist pattern thickening material of the present invention, showing a state where the resist pattern thickening material infiltrated the resist pattern surface.

After forming a resist pattern 3 on the surface of a workpiece (base material) 5 as shown in FIG. 1, a resist pattern thickening material 1 is provided (applied) on the surface of the resist pattern 3, and is baked (heated and dried) to form a coated film. At this point, mixing (infiltration) of the resist pattern thickening material 1 into the resist pattern 3 occurs at the interface between the resist pattern 3 and the resist pattern thickening material 1. As shown in FIG. 2, a reaction then occurs between the mixed (infiltrated) portion of the resist pattern thickening material 1 and the resist pattern 3 at the interface between an inner layer resist pattern 10b (the resist pattern 3) and the resist pattern thickening material 1, resulting in the formation of a surface layer (mixing layer) 10a. Since the resist pattern thickening material 1 contains a compound represented by the general formula (1) at this point, the inner layer resist pattern 10b (the resist pattern 3) is stably and uniformly thickened without being affected by its original size.

Figure 3:
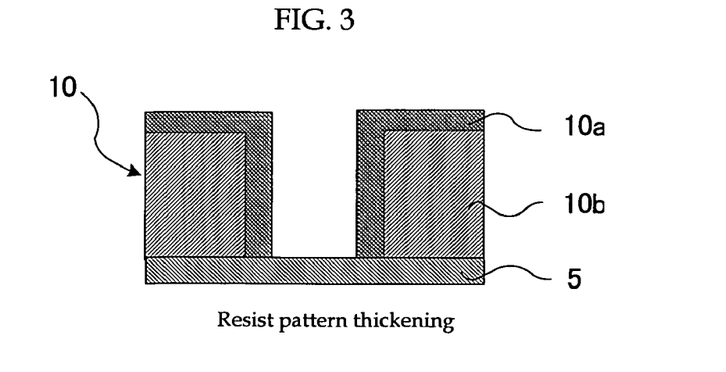
FIG. 3 is an explanatory diagram of the mechanism by which the resist pattern is thickened by means of the resist pattern thickening material of the present invention, showing a state where the resist pattern surface is thickened by means of the resist pattern thickening material.

Subsequently, as shown in FIG. 3, a development process is performed to dissolve the resist pattern thickening material 1 to remove the portion with no interaction (mixing) with the resist pattern 3 or the portion with less interaction with it, i.e., portions with high water-solubility. In this way a thickened resist pattern 10 is formed (developed), which is a uniformly thickened resist pattern.

Note that the development process may be performed either using a water developer or an alkali developer.

The thickened resist pattern 10 has, on the surface of the inner layer resist pattern 10b (the resist pattern 3), the surface layer (mixing layer) 10a that has resulted from the reaction between the resist pattern thickening material 1 and the resist pattern 3. Since the thickened resist pattern 10 is thicker than the resist pattern 3 by an amount corresponding to the thickness of the surface layer (mixing layer) 10a, the size of the space pattern—the distance between adjacent lines of the thickened resist pattern 10 or the opening diameter of the hole pattern formed using the thickened resist pattern 10—is smaller than that of the one formed using the resist pattern 3 that is not thickened. Thus, it is possible to form a fine space pattern, exceeding the exposure or resolution limits of the light source of an exposure device. To be more specific, even when exposure is performed using ArF excimer laser light, the resultant space pattern has as fine precise lines and/or holes as those obtained using, for example, an electron beam. The space pattern formed using the thickened resist pattern 10 has finer, more precise lines and/or holes than does the space pattern formed using the resist pattern 3.

The surface layer (mixing layer) 10a in the thickened resist pattern 10 is made of the resist pattern material 1, and the compound represented by the general formula (1) in the resist pattern thickening material 1 contains a moiety having a cyclic structure. For this reason, even when the resist pattern 3 (inner layer resist pattern 10b) is made of material with poor etching resistance, the resultant thickened resist pattern 10 will have excellent etching resistance.

The resist pattern thickening material of the present invention can be suitably used for thickening a resist pattern, and miniaturizing the space pattern, exceeding the exposure limits. In addition, the resist pattern thickening material of the present invention can be suitably used for the process of the present invention for forming a resist pattern, the method of the present invention for manufacturing a semiconductor device, and the like.

Moreover, the compound represented by the general formula (1) in the resist pattern thickening material of the present invention contains a moiety having a cyclic structure. For this reason, the resist pattern thickening material of the present invention can be suitably used to coat or thicken a resist pattern made of resin or the like, which will be exposed to plasma and the like and thus require improved etching resistance on its surface.

(Process for Forming a Resist Pattern)

The process of the present invention for forming a resist pattern includes forming a resist pattern, and applying the resist pattern thickening material of the present invention over the resist pattern so as to cover the surface of the resist pattern, and further includes an additional step on an as-needed basis that are appropriately selected.

Suitable examples of the resist pattern materials are those described in the description of the resist pattern thickening material of the present invention.

The resist pattern can be formed using known methods.

The resist pattern can be formed on the surface of a workpiece (base material). The surface of a workpiece (base material) is not particularly limited and can be appropriately selected depending on the intended use. When the resist pattern is to be formed in a semiconductor device, it is formed on the surface of a semiconductor substrate. Specifically, the resist pattern is suitably formed, for example, on the surface of substrates such as silicon wafers, and various types of oxide films.

The method for applying the resist pattern thickening material is not particularly limited and can be selected from known coating methods depending on the intended use; spin coating is suitably used. For example, the spin coating is performed under the following conditions: rotational speed=about 100 rpm to 10,000 rpm, more preferably 800 rpm to 5,000 rpm; time=about 1 second to 10 minutes, more preferably 1 second to 90 seconds.

The thickness of the applied resist pattern thickening material generally ranges from about 100 Å to 10,000 Å (10 nm to 1,000 nm), more preferably ranges from about 1,000 Å to 5,000 Å (100 nm to 500 nm).

Note that in such a coating process the surfactant may be applied on the resist pattern before coating it with the resist pattern thickening material, rather than applying the surfactant with after mixing it with the resist pattern thickening material.

The resist pattern thickening material thus applied is then pre-baked (heated and dried) either during the coating process or after that process, thereby allowing the resist pattern-thickening material to efficiently mix with (or infiltrate) the resist pattern at their interface.

Note that the pre-baking (heating and drying) process and the conditions under which it is performed are not particularly limited unless a resist pattern is softened, and can be appropriately selected depending on the intended use. For example, the pre-baking process may be carried out once, or twice, or more. When the pre-baking process is to be carried out twice or more, the pre-baking temperature may be constant or variable throughout each round of the process. If the pre-baking temperature is constant, the pre-baking temperature is preferably about 40° C. to 150° C., more preferably 70° C. to 120° C., and the pre-baking times is preferably about 10 seconds to 5 minutes, more preferably 40 seconds to 100 seconds.

After the pre-baking (heating and drying) process, it is also preferable to perform a reaction baking process for facilitating the reaction between the applied resist pattern thickening material and the resist pattern. This is because this process can efficiently facilitate the reaction of the mixed (infiltrated) portion occurring at the interface of the resist pattern and the resist pattern thickening material.

Note that the reaction baking (heating and drying) process and the conditions under which it is performed are not particularly limited, and can be appropriately selected depending on the intended use. The baking temperature is, however, higher in this reaction baking process than in the foregoing pre-baking (heating and drying) process. For example, the baking temperature is about 70° C. to 150° C., more preferably 90° C. to 130° C., and the baking time is 10 seconds to 5 minutes, more preferably 40 seconds to 100 seconds.

Moreover, it is preferable to subject the applied resist pattern thickening material to a development process after the reaction baking process. This is because it is possible to form (develop) a thickened resist pattern by dissolving the resist pattern thickening material to remove the portion with no interaction (mixing) with the resist pattern, or the portion with less interaction with it, i.e., portions with high water solubility.

Note that this development process is performed in the same manner as described above.

Hereinafter, the process of the present invention for forming a resist pattern will be described with reference to the drawings.

Figure 4:
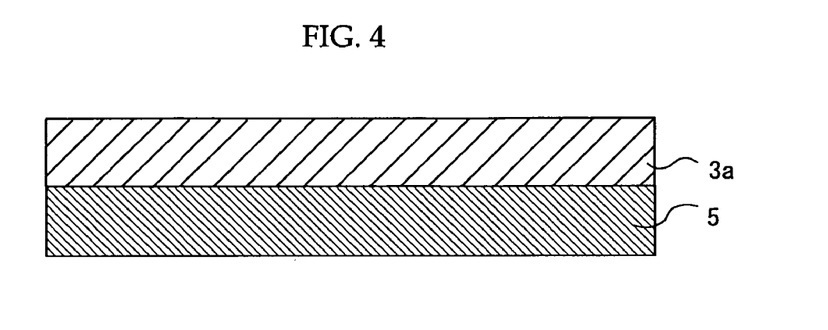
FIG. 4 is a schematic diagram for explaining an example of a process of the present invention for forming a resist pattern, showing a state where a resist film is formed.
Figure 5:
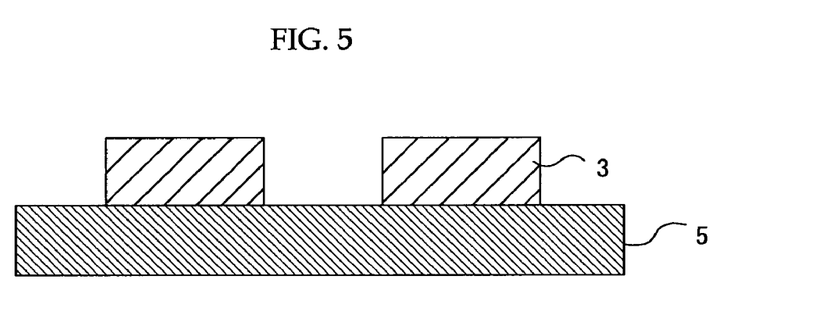
FIG. 5 is a schematic diagram for explaining the example of the process of the present invention for forming a resist pattern, showing a state where a resist pattern is formed by patterning the resist film.
Figure 6:
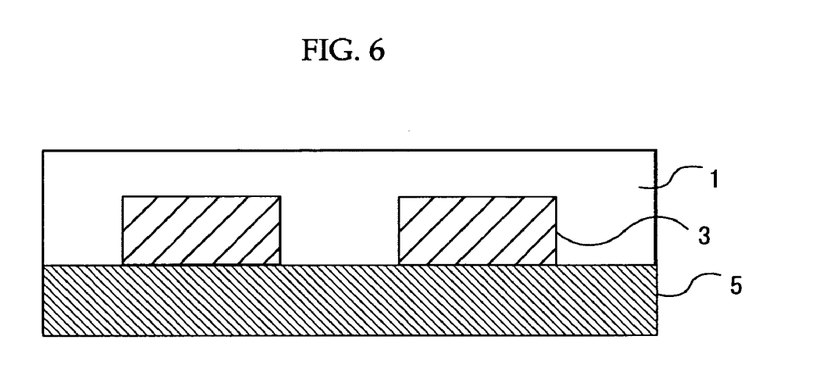
FIG. 6 is a schematic diagram for explaining the example of the process of the present invention for forming a resist pattern, showing a state where the resist pattern thickening material is applied over the resist pattern surface.
Figure 7:
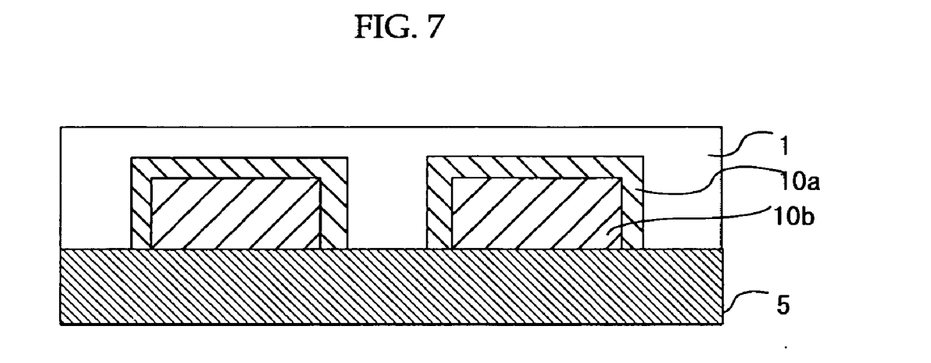
FIG. 7 is a schematic diagram for explaining the example of the process of the present invention for forming a resist pattern, showing a state where the resist pattern thickening material is mixed with and infiltrated the resist pattern surface.
Figure 8:
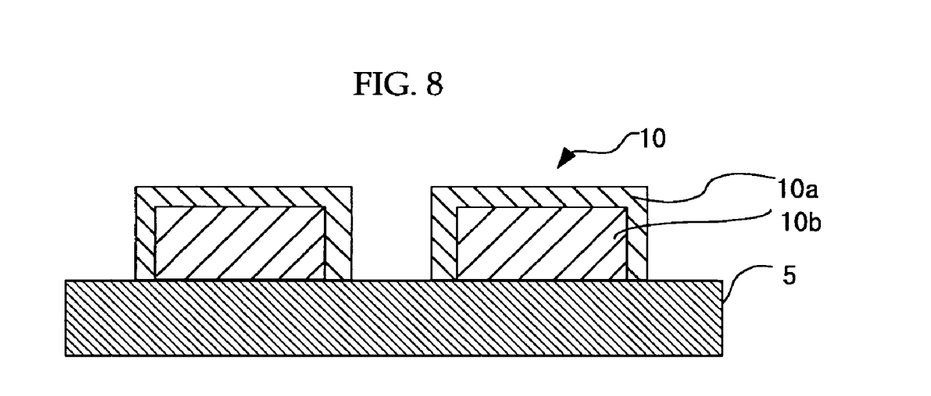
FIG. 8 is a schematic diagram for explaining the example of the process of the present invention for forming a resist pattern, showing a state where the thickened resist pattern is developed.

After applying a resist pattern material 3a on a work surface (base material) 5 as shown in FIG. 4, the resist pattern material 3a is patterned to form a resist pattern 3 as shown in FIG. 5. Thereafter, a resist pattern thickening material 1 is applied on the surface of the resist pattern 3, and is baked (heated and dried) to form a coated film. At this point, mixing (infiltration) of the resist pattern thickening material 1 into the resist pattern 3 occurs at the interface between the resist pattern 3 and the resist pattern thickening material 1. As shown in FIG. 7, a reaction then occurs between the mixed (infiltrated) portion of the resist pattern thickening material 1 and the resist pattern 3 at the interface between the resist pattern 3 and the resist pattern thickening material 1. Subsequently, as shown in FIG. 8, a development process is performed to dissolve the resist pattern thickening material 1 to remove the portion with no interaction (mixing) with the resist pattern 3, or the portion with less interaction with it, i.e., portions with high water solubility. In this way a thickened resist pattern 10 is formed (developed), where a surface layer 10a is formed on an inner resist pattern 10b (resist pattern 3).

Note that although the development process may be performed either using a water developer or an alkali developer, a development process using a water developer is preferable because it is efficient and features low costs.

The thickened resist pattern 10 obtained by means of the resist pattern thickening material 1 has, on the surface of the inner layer resist pattern 10b (the resist pattern 3), the surface layer (mixing layer) 10a that has resulted from the reaction between the resist pattern thickening material 1 and the resist pattern 3. Since the resist pattern thickening material 1 contains a compound represented by the general formula (1), the resist pattern 3 is stably and uniformly thickened to form the thickened resist pattern 10 regardless of the type or size of the resist pattern material. Furthermore, since the thickened resist pattern 10 is thicker than the resist pattern 3 (inner resist pattern 10b) by an amount corresponding to the thickness of the surface layer 10a, the line-width of the space pattern formed using the thickened resist pattern 10 is smaller than that of the one formed using the resist pattern 3 (inner layer resist pattern 10b). Thus, a space pattern formed using the thickened resist pattern 10 is fine.

The surface layer (mixing layer) 10a in the thickened resist pattern 10 is formed of the resist pattern material 1, and the compound represented by the general formula (1) in the resist pattern thickening material 1 contains a moiety having a cyclic structure. For this reason, even when the resist pattern 3 (inner layer resist pattern 10b) is made of material with poor etching resistance, it is possible to form a thickened resist pattern 10, the surface of which has a surface layer (mixing layer) 10a with excellent etching resistance.

The resist pattern produced by the process of the present invention for forming a resist pattern (hereinafter referred to as "thickened resist pattern" in some cases) includes a surface layer formed as a result of an interaction of the resist pattern thickening material of the present invention with the surface of the resist pattern. The resist pattern thickening material contains a compound represented by the general formula (1) containing a moiety having a cyclic structure. For this reason, even when the resist pattern is made of material with poor etching resistance, it is possible to efficiently produce a thickened resist pattern that has a surface layer (mixing layer) with excellent etching resistance on the surface. In addition, since the thickened resist pattern produced by the process of the present invention for forming a resist pattern is thickened by an amount corresponding to the thickness of the surface layer (mixing layer), the size (e.g., opening-diameter and/or linewidth) of a space pattern formed using the produced thickened resist pattern 10 is smaller than that of the one formed using the foregoing resist pattern. Thus, it is possible to produce a fine space pattern efficiently by the process of the present invention for forming a resist pattern.

Whether or not the surface layer (mixing layer) contains the moiety having a cyclic structure can be determined by analyzing the IR absorption spectrum of the surface layer (mixing layer), for example.

The process of the present invention for forming a resist pattern can be suitably used for the formation of various spaces patterns such as a line-and-space pattern, hole pattern (e.g., for contact holes), and trench pattern. The thickened resist pattern produced by this process can be suitably used as a mask pattern, reticle pattern, or the like, can be used, for example, for the manufacture of functional parts such as metallic plugs, interconnections, magnetic heads, liquid crystal displays (LCDs), plasma display panels (PDPs) and surface acoustic wave filters (SAW filters); optical parts for optical interconnection; fine parts such as microactuators; and semiconductor devices, and can be employed in the method of the present invention for manufacturing a semiconductor device, which will be described later.

(The Method for Manufacturing a Semiconductor Device)

The method of the present invention for manufacturing a semiconductor device includes a resist pattern formation step and a patterning step, and further includes an additional step on an as-needed basis.

The resist pattern formation step is a step in which a resist pattern is formed on the surface of a workpiece and the resist pattern thickening material of the present invention is applied thereon in such a way as to cover the resist pattern to thicken the resist pattern. Through the resist pattern formation step, a thickened resist pattern is formed on the surface of the workpiece.

The details of the resist pattern formation step are similar to those of the process of the present invention for forming a resist pattern.

Examples of the surface of the workpiece include surface layers of parts of a semiconductor device; among these, substrates (e.g., silicon wafers) or the surfaces thereof, and various oxide films are suitable. The resist pattern is formed as described above, and the coating process is performed as described above, which is preferably followed by the above-described pre-baking process, reaction baking process and the like.

The patterning step is a step in which the workpiece surface is patterned by etching using the thickened resist pattern formed in the resist pattern formation step as a mask or the like (i.e., as a mask pattern or the like).

The etching method is not particularly limited and can be appropriately selected from known methods depending on the intended use; dry etching is a suitable example. The etching conditions are not particularly limited and can be set depending on the intended purpose.

Suitable examples of the additional step include a surfactant application step and a development step.

The surfactant application step is a step for applying the surfactant on the surface of the resist pattern prior to the resist pattern formation step.

The surfactant is not particularly limited and can be appropriately selected depending on the intended use; suitable examples thereof include the surfactants listed above, such as polyoxyethylene-polyoxypropylene condensation products, polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, natural alcohols, ethylene diamines, secondary alcohol ethoxylates, alkyl cations, amide quaternary cations, ester quaternary cations, amine oxides and betaines.

The development step is a step in which the applied resist pattern thickening material is subjected to a development treatment between the resist pattern formation step and the patterning step. Note that the development step is performed as described above.

With the method of the present invention for manufacturing a semiconductor device, it is possible to efficiently manufacture various types of semiconductor devices including flash memories, DRAMs and FRAMs.

Although Examples of the present invention will be described below, the present invention is not limited to these Examples.

Example 1

—Preparation of Resist Pattern Thickening Materials—

Resist pattern thickening materials A to O having compositions shown in Table 1 were prepared.

Note in Table 1 that the term "thickening material" means a resist pattern thickening material and that the letters "A" to "O" correspond to the resist pattern thickening materials A to O. Out of the resist pattern thickening materials A to O, the resist pattern thickening materials M to O were those prepared in Comparative Example and the resist pattern thickening materials A to L were those prepared in Examples of the present invention. In Table 1 the units in parentheses represent "parts by mass (g)."

Phenylalanine, phenyllactic acid, phenylglycine and 1-methyl-cyclohexylcarboxylic acid, which are listed in the "Compound Represented by the General Formula (1)" column for the resist pattern thickening materials A to L, are all compounds represented by the following general formula (1):

General Formula (1)

where R represents a moiety having a cyclic structure, X represents a monovalent organic group containing a carboxylic group, Y represents at least any one of a hydroxyl group, an alkyl group, an alkoxy group, an amino group, an amino group substituted with an alkyl group, a carbonyl group and an alkoxycarbonyl group, m represents an integer of 1 or greater, and n represent an integer of 0 or greater.

In the "Resin" column "KW-3" represents polyvinyl acetal resin (manufactured by Sekisui Chemical Co., Ltd.) and "PVA" represents polyvinyl alcohol resin ("PVA-205C" manufactured by Kuraray Co., Ltd.). In the "Surfactant" column "PC-6" represents a nonionic surfactant (a polynuclear phenol surfactant manufactured by ASAHI DENKA, Co., Ltd.), "TN-80" represents a nonionic surfactant (a primary alcohol ethoxylate surfactant manufactured by ASAHI DENKA, Co., Ltd.), and "SO-145" represents a nonionic surfactant (a secondary alcohol ethoxylate surfactant manufactured by ASAHI DENKA, Co., Ltd.).

Mixtures of pure water (deionized water) and isopropylalcohol, an organic solvent, were prepared as solvents; for the resist pattern thickening materials A to C and J to O, the amounts of pure water (deionized water) and isopropylalcohol are 98.6 parts by mass (g) and 0.4 part by mass (g), respectively, while for the resist pattern thickening materials D to I, the amounts of pure water (deionized water) and isopropylalcohol are 98.4 parts by mass (g) and 0.4 part by mass (g), respectively.

TABLE 1

| Thickening Material | Resin (Parts by Mass) | Compound Represented by General Formula (1) | Solvent (Parts by mass) | Surfactant (Parts by Mass) |
|---|---|---|---|---|
| A | KW-3(16) | Phenylalanine (1) | PureWater (98.6) + IPA (0.4) | — |
| B | KW-3(16) | Phenyllactic Acid (1) | PureWater (98.6) + IPA (0.4) | — |
| C | KW-3(16) | Phenyllactic Acid (1) | PureWater (98.6) + IPA (0.4) | PC-6(0.25) |
| D | PVA(4) | Phenylglycine (0.5) | PureWater (98.4) + IPA (0.4) | — |
| E | PVA(4) | Phenylglycine (1) | PureWater (98.4) + IPA (0.4) | — |
| F | PVA(4) | Phenylalanine (1) | PureWater (98.4) + IPA (0.4) | — |
| G | PVA(4) | Phenyllactic Acid (0.5) | PureWater (98.4) + IPA (0.4) | — |
| H | PVA(4) | Phenyllactic Acid (1) | PureWater (98.4) + IPA (0.4) | — |
| I | PVA(4) | Phenyllactic Acid (3) | PureWater (98.4) + IPA (0.4) | — |
| J | PVA(4) | Phenyllactic Acid (1) | PureWater (98.6) + IPA (0.4) | TN-80(0.25) |
| K | PVA(4) | Phenyllactic Acid (1) | PureWater (98.6) + IPA (0.4) | PC-6(0.25) |
| L | PVA(4) | 1-methyl-cyclohexylcarboxylic acid (1) | PureWater (98.6) + IPA (0.4) | SO-145(0.1) |
| M | PVA(4) | — | PureWater (98.6) + IPA (0.4) | — |
| N | PVA(4) | — | PureWater (98.6) + IPA (0.4) | TN-80(0.25) |
| O | PVA(4) | Note1 | PureWater (98.6) + IPA (0.4) | PC-6(0.25) |

Note1:
1.35 parts by mass of tetramethoxymethyl glycouril was added as a crosslinking agent in place of a compound represented by the general formula (1).

—Resist Pattern Formation—

By spin coating, the resist pattern thickening materials A to O thus prepared were applied on different hole patterns, which have opening diameters shown in the "Space Pattern Size Before Thickened" column in Table 2 and which had been formed using an alicyclic ArF resist ("AR1244J" manufactured by JSR Corporation), under the condition of 1,000 rpm/5 s at early stages and under the condition of 3,500 rpm/40 s at later stages, followed by a baking process under the condition of 110° C./60 s. The resist pattern thickening materials A to O were then rinsed with pure water for 60 seconds, and subjected to a development process to remove unreacted portions, or portions with no interaction (mixing) with the resist patterns, to form thickened resist patterns.

Table 2 lists the sizes of space patterns formed using these thickened resist patterns, which correspond to the values in the "Space Pattern Size After Thickened" column in Table 2, together with the initial space pattern sizes (i.e., the sizes of space patterns formed using resist patterns before thickened, corresponding to the values in the "Space Pattern Size Before Thickened" column in Table 2). Note in Table 2 that the letters "A" to "O" correspond to the resist pattern thickening materials A to O.

TABLE 2

| Thickening Material | Space Pattern Size Before Thickened (nm) | Space Pattern Size After Thickened (nm) |
|---|---|---|
| A | 108.5 | 93.8 |
| B | 110.6 | 93.6 |
| C | 107.9 | 89.3 |
| D | 109.8 | 101.6 |
| E | 109.1 | 96.1 |
| F | 109.3 | 93.5 |
| G | 110.0 | 100.6 |
| H | 107.3 | 96.4 |
| I | 107.9 | 94.6 |
| J | 108.6 | 92.5 |
| K | 107.7 | 92.1 |
| L | 106.6 | 98.3 |
| M | 110.2 | 105.9 |
| N | 108.3 | 107.2 |
| O | 108.1 | 81.9 |

From Table 2, it was established that the use of the resist pattern thickening materials of the present invention for the formation of a hole pattern can reduce the inner diameters of the holes created, and that the magnitude of change in inner diameter is smaller with the resist pattern thickening materials M and N prepared in Comparative Example, which do not contain compounds represented by the general formula (1), than with the resist pattern thickening materials A to L which contain compounds expressed by general formula (1). Moreover, it was established that the inner diameter of holes in the hole pattern are significantly reduced with the resist pattern thickening material O that contains a crosslinking agent but not a compound represented by the general formula (1).

By spin coating, the resist pattern thickening materials K and O thus prepared were applied onto different trench patterns which had been formed using an alicyclic ArF resist ("AR1244J" manufactured by JSR Corporation) and have various trench sizes—about 100 nm, 200 nm, and 300 nm as shown in the "Space Pattern Size Before Thickened" column in Table 3, under the condition of 1,000 rpm/5 s at early stages and under the condition of 3,500 rpm/40 s at later stages, followed by a baking process under the condition of 110° C./60 s. The resist pattern thickening materials K and O were then rinsed with pure water for 60 seconds, and subjected to a development process to remove unreacted portions, or portions with no interaction (mixing) with the trench patterns, to form thickened resist patterns.

Table 3 lists the amounts of reduction (nm) in the size of the space patterns that were formed using the thickened resist patterns K and O—the difference between the size of the space pattern after thickened and the size of the space pattern before thickened shown in Table 3—together with the initial space pattern sizes (i.e., the sizes of space patterns formed using resist patterns before thickened, corresponding to the values in the "Space Pattern Size Before Thickened" column in Table 3). Note in Table 3 that the thickening materials "K" and "O" correspond to the resist pattern thickening materials K and O.

TABLE 3

| Space Pattern Size Before Thickened (nm) | | The Amount of Reduction in Space Pattern Size After thickened (nm) | |
|---|---|---|---|
| Thickening Material K | Thickening Material O | Thickening Material K | Thickening Material O |
| 107.7 | 108.1 | 15.6 | 26.2 |
| 205.0 | 204.1 | 16.7 | 39.9 |
| 300.1 | 300.3 | 17.0 | 52.1 |

It was established that the use of the resist pattern thickening material K can realize formation of a dense, uniform and fine patterns of trench while minimizing its dependence on the trench pattern size (see Table 3).

In addition, it was established that, when the resist pattern thickening material O in Comparative Example, a conventional resist pattern thickening material containing a uryl crosslinking agent, is used for the formation of a trench pattern, the trench pattern cannot be thickened uniformly because the amount of reduction in the space pattern size is highly dependent on the size of the trench pattern before thickened, i.e., the larger the initial space pattern size, the more the amount of reduction in the space pattern size after the thickening of the trench pattern.

Next, the resist pattern thickening materials A, J and K were applied on the surface of each of resists formed on silicon substrates to form surface layers of 500 nm thickness. Using an etching machine (parallel-plain type RIE, manufactured by Fujitsu Limited), etching was then performed for these layers, as well as for the KrF resist (UV-6, produced by Shipley Company L.L.C) and polymethylmethacrylate (PMMA) for comparison; etching was performed under the following conditions: etching time=3 minutes; Pμ=200 W; pressure=0.02 Torr; CF$_4$ gas=80 sccm. These samples were then evaluated for their etching rate by determining the etched amounts, with the etching rate of the KrF resist being used as a reference (=1.00). The results are shown in Table 4.

TABLE 4

| Material | Etching Rate (nm/s) | Ratio |
|---|---|---|
| UV-6 | 52.0 | 1.00 |
| PMMA | 64.2 | 1.23 |
| A | 54.0 | 1.04 |
| J | 51.3 | 0.99 |
| K | 55.4 | 1.06 |

From the result shown in Table 4, it was established that since the resist pattern thickening materials of the present invention all contain a compound represented by the general formula (1), they exhibit more excellent etching resistance than PMMA, which is as high as that of the KrF resist.

Example 2

Figure 9:
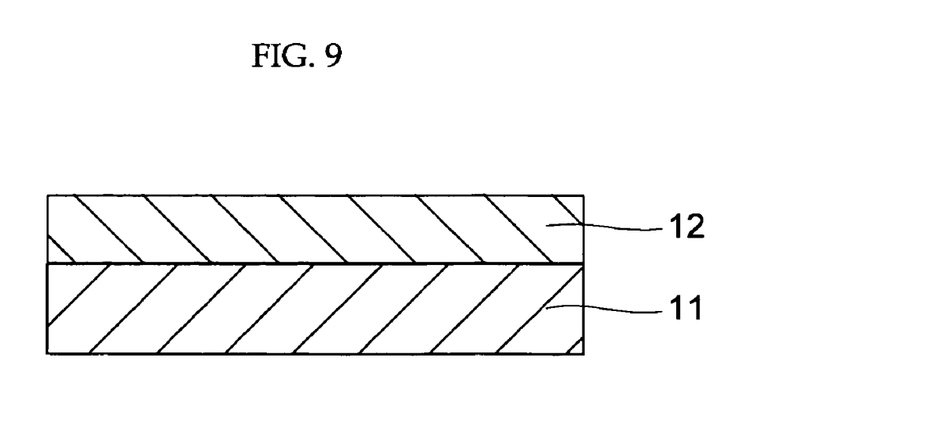
FIG. 9 is a schematic diagram for explaining an example of a method of the present invention for manufacturing a semiconductor device, showing a state where an interlayer dielectric film is formed on a silicon substrate.
Figure 10:
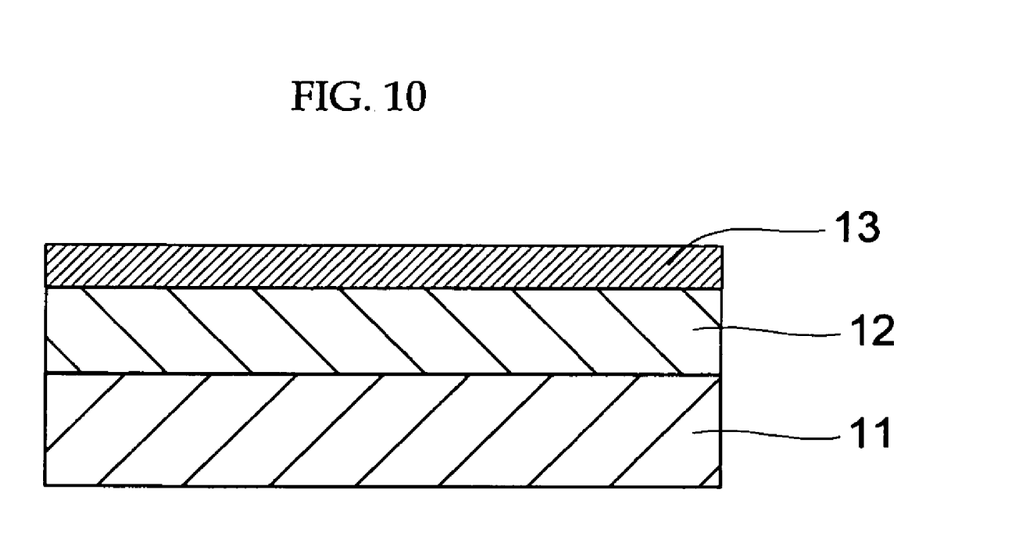
FIG. 10 is a schematic diagram for explaining the example of the method of the present invention for manufacturing a semiconductor device, showing a state where a titanium film is formed on the interlayer dielectric film shown in FIG. 9.
Figure 11:
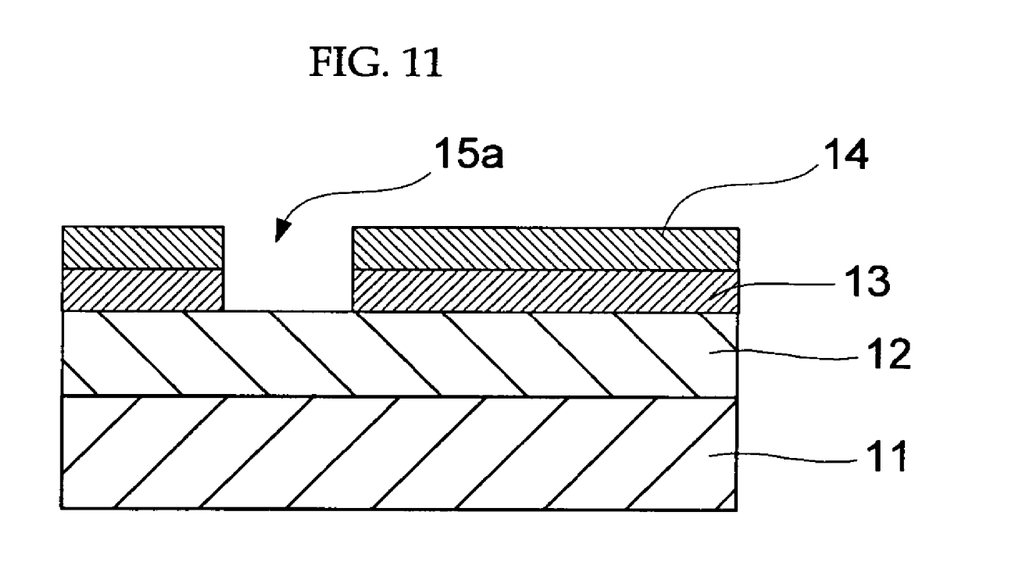
FIG. 11 is a schematic diagram for explaining the example of the method of the present invention for manufacturing a semiconductor device, showing a state where a resist film is formed on the titanium film and a hole pattern is formed in the titanium film.
Figure 12:
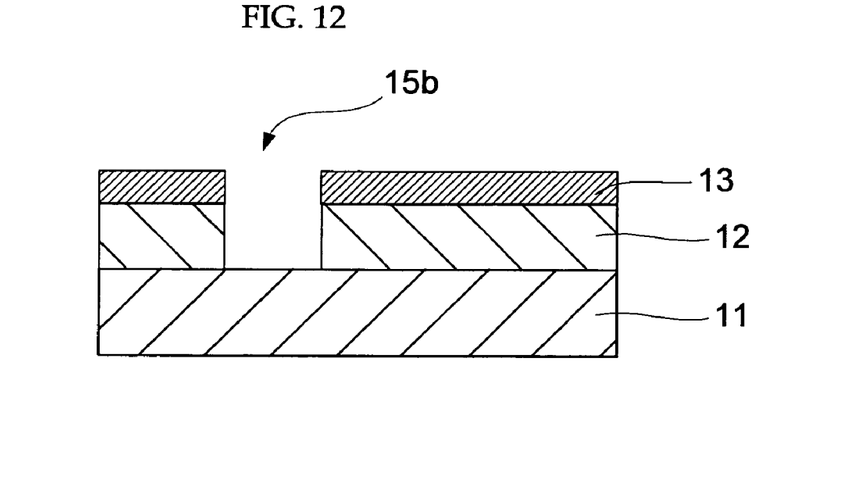
FIG. 12 is a schematic diagram for explaining the example of the method of the present invention for manufacturing a semiconductor device, showing a state where a hole pattern is also formed in the interlayer dielectric film.

As shown in FIG. 9, the interlayer dielectric film 12 was formed on a silicon substrate 11 and as shown in FIG. 10, a titanium film 13 was formed on the interlayer dielectric film 12 by sputtering. Next, as shown in FIG. 11, a resist pattern 14 was formed by a known photolithographic technique. Using the resist pattern 14 as a mask, the titanium film 13 was patterned by reactive ion etching to form an opening 15a. Subsequently, reactive ion etching was performed to remove the resist pattern 14 and, at the same time, as shown in FIG. 12, an opening 15b was formed in the interlayer dielectric film 12 using the titanium film 13 as a mask.

Figure 13:
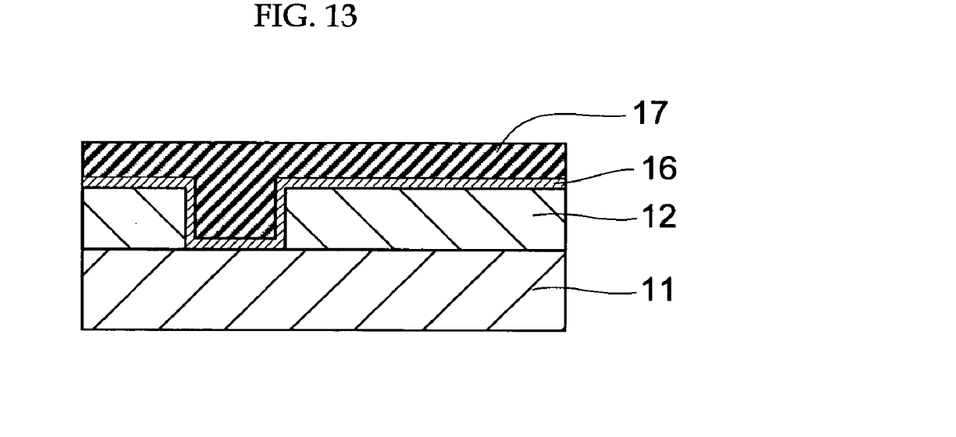
FIG. 13 is a schematic diagram for explaining the example of the method of the present invention for manufacturing a semiconductor device, showing a state where a Cu film is formed on the interlayer dielectric film provided with the hole pattern.
Figure 14:
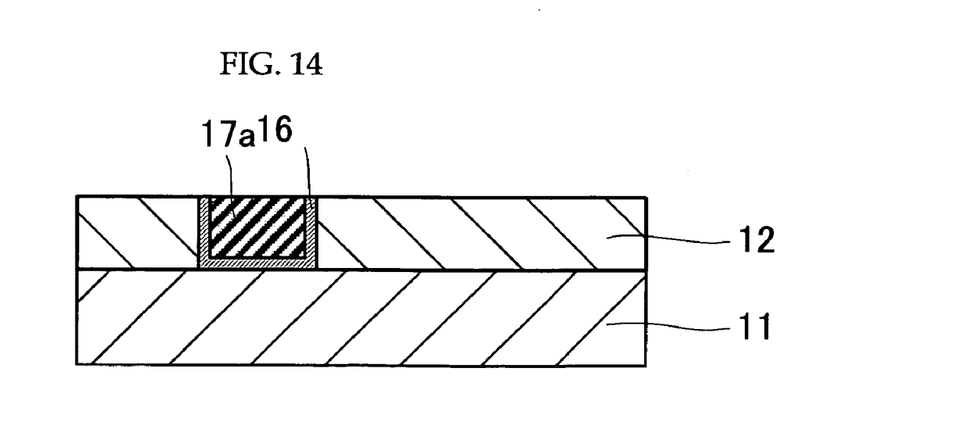
FIG. 14 is a schematic diagram for explaining the example of the method of the present invention for manufacturing a semiconductor device, showing a state where Cu deposited on the interlayer dielectric film is removed while leaving the hole pattern filled with it.

Next, the titanium film 13 was removed in a wet processing and as shown in FIG. 13, a TiN film 16 was formed on the interlayer dielectric film 12 by sputtering. By electrolytic plating, a Cu film 17 was then deposited on the TiN film 16. As shown in FIG. 14, the surface of the silicon substrate 11 was then planarized by removing the barrier metal and the Cu film (first metallic film) using CMP, with the grooves corresponding to the opening 15b (shown in FIG. 12) left filled with them. In this way a first layer interconnection 17a was formed.

Figure 15:
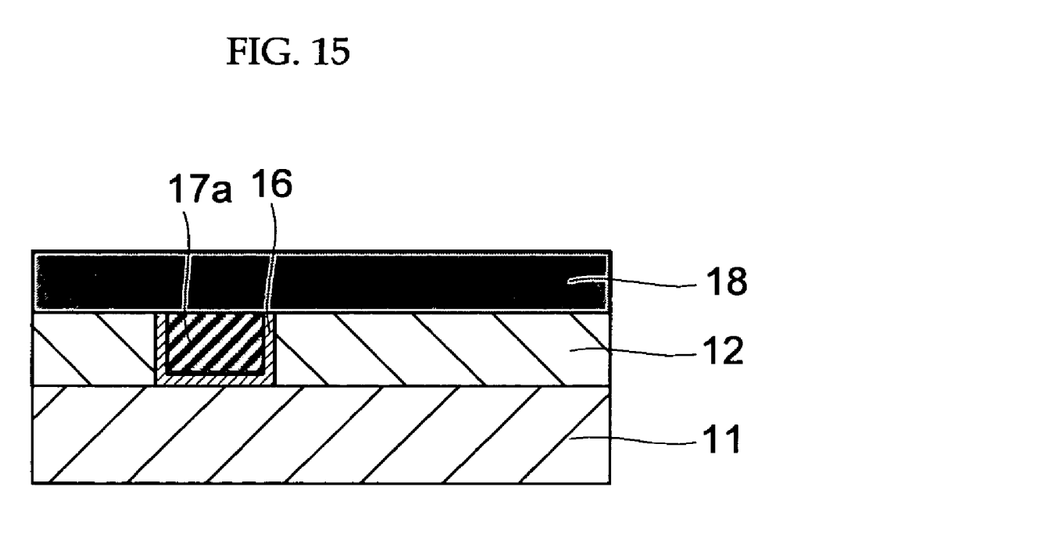
FIG. 15 is a schematic diagram for explaining the example of the method of the present invention for manufacturing a semiconductor device, showing a state where another interlayer dielectric film is formed both on the Cu plug formed in the hole pattern and the interlayer dielectric film.
Figure 16:
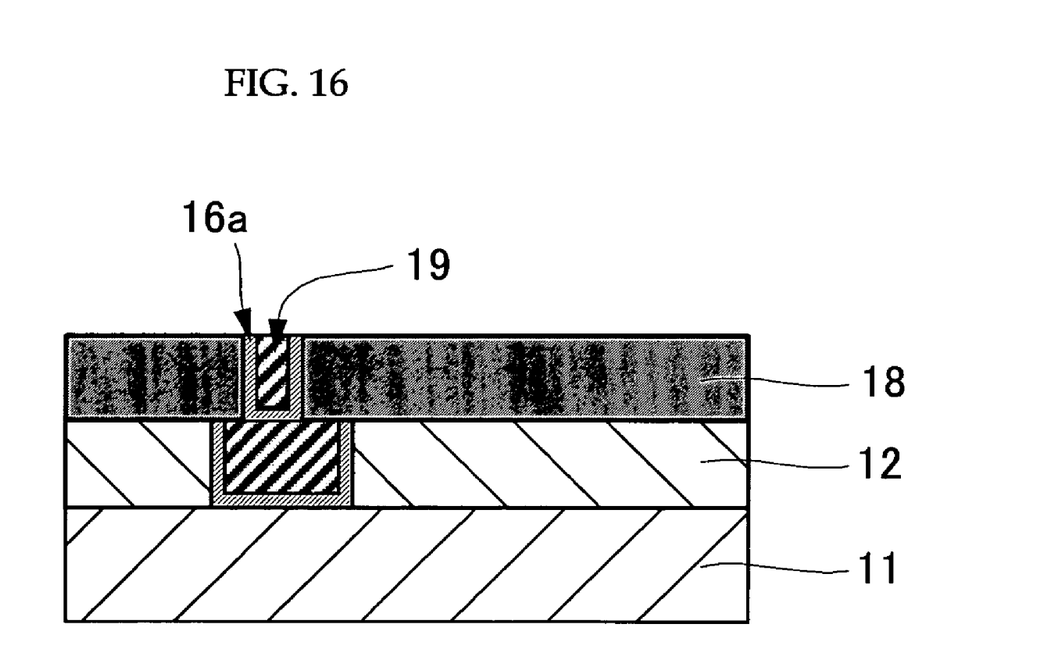
FIG. 16 is a schematic diagram for explaining the example of the method of the present invention for manufacturing a semiconductor device, showing a state where a hole pattern is formed in the interlayer dielectric film serving as a surface layer and a Cu plug is formed therein.

Next, as shown in FIG. 15, an interlayer dielectric film 18 was formed on the first layer interconnection 17a. Thereafter, as shown in FIG. 16, a Cu plug (second metallic film) 19 and TiN film 16a, which serve to connect the first layer interconnection 17a to upper layer interconnections to be formed later, were formed in a similar manner as those shown in FIGS. 9 to 14.

Figure 17:
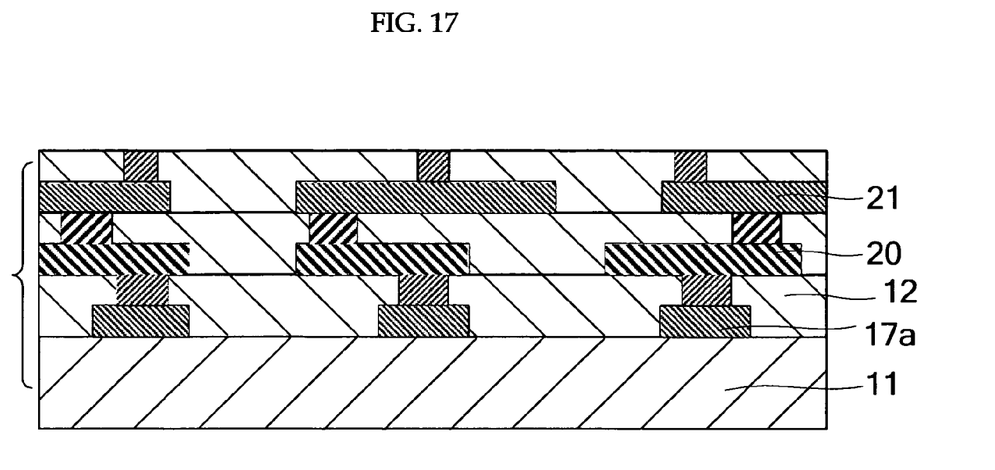
FIG. 17 is a schematic diagram for explaining the example of the method of the present invention for manufacturing a semiconductor device, showing a state where a three-level interconnection structure is formed.

By repeating the steps described above, a semiconductor device with a multilevel-interconnection structure that has the first layer interconnection 17a, a second layer interconnection 20, and a third layer interconnection 21 which are sequentially provided on the silicon substrate 11 was manufactured as shown in FIG. 17. Note in FIG. 17 that barrier metallic layers formed beneath each of these layers are not shown.

In Example 2 the resist pattern 14 is a thickened resist pattern formed in the same manner described in Examples 1 and 2, where the resist pattern thickening material of the present invention is used.

According to the present invention, it is possible to solve the foregoing problems and to achieve the foregoing objects.

According to the present invention, it is possible to provide a resist pattern thickening material which can utilize ArF excimer laser light as exposure light in a patterning process; which, when applied over a resist pattern such as a line-space pattern formed using an ArF resist or the like, can uniformly and stably thicken the resist pattern regardless of the composition or size of the resist material while reducing the roughness of the surface thereof; which has excellent etching resistance; and which can achieve easy, efficient, and low cost formation of a fine space pattern, exceeding the exposure (resolution) limits of the light source of an exposure device.

According to the present invention, it is possible to provide a process for forming a resist pattern, which can utilize ArF excimer laser light as exposure light in a patterning process; which can uniformly and stably thicken a resist pattern such as line-space pattern regardless of the composition or size of the resist material while reducing the roughness of the surface thereof; and which can achieve easy, efficient, and low cost formation of a fine space pattern, exceeding the exposure (resolution) limits of the light source of an exposure device.

Moreover, according to the present invention, it is possible to provide a method for manufacturing a semiconductor device, which can utilize ArF excimer laser light as exposure light in a patterning process; which can form a fine space pattern, exceeding the exposure (resolution) limits of the light source of an exposure device; and which can efficiently mass produce high-performance semiconductor devices having fine interconnection patterns formed using the space pattern; and a high-performance semiconductor device having fine interconnection patterns, which is manufactured by the process for manufacturing a semiconductor device.

The resist pattern thickening material of the present invention can be suitably used for the process for forming a fine space pattern, interconnection pattern, etc, by thickening a resist pattern formed using an ArF resist or the like, exceeding the exposure limits of exposure light in a patterning process, as well as for various patterning methods and semiconductor manufacturing methods. In particular, the resist pattern thickening material of the present invention can be suitably used for the process of the present invention for forming a resist pattern, and for the method of the present invention for manufacturing a semiconductor device.

The process of the present invention for forming a resist pattern can be suitably used for the production of, for example, functional parts such as a mask pattern, reticle pattern, magnetic heads, liquid crystal displays (LCDs), plasma display panels (PDPs) and surface acoustic wave filters (SAW filters); optical parts for optical interconnection; fine parts such as microactuators; and semiconductor devices, and can be suitably employed in the method of the present invention for manufacturing a semiconductor device.

The method of the present invention for manufacturing a semiconductor device can be employed for manufacturing various semiconductor devices including flash memories, DRAMs, and FRAMs.

What is claimed is:

1. A process for forming a thickened resist pattern, comprising:
    forming a resist pattern; and
    applying a resist pattern thickening material over the resist pattern so as to cover a surface of the resist pattern,
    wherein the resist pattern thickening material consists of:
    a resin;
    water; and
    a compound selected from the group consisting of: phenylalanine, phenylglycine, tyrosine, phenyllactic acid, hydroxyphenylpyruvic acid, aminotetralincarboxylic acid, aminophenylpropionic acid, phenylglutamic acid, phenylenedipropionic acid, benzylserine, naphthylalanine, methylcyclohexanecarboxylic acid, aminocyclohexanecarboxylic acid, and aminobicycloheptanecarboxylic acid.

2. The process for forming a thickened resist pattern according to claim 1, further comprising:
    developing the resist pattern thickening material after application of the resist pattern thickening material.

* * * * *